United States Patent
Lin

(10) Patent No.: US 8,854,028 B2
(45) Date of Patent: Oct. 7, 2014

(54) SIGNAL LEVEL DETECTOR AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 283 days.

(21) Appl. No.: 13/299,594

(22) Filed: Nov. 18, 2011

(65) Prior Publication Data

US 2013/0128642 A1    May 23, 2013

(51) Int. Cl.
*G05F 3/04* (2006.01)
*H03K 19/0175* (2006.01)
*H04B 17/00* (2006.01)

(52) U.S. Cl.
CPC ........ *H03K 19/0175* (2013.01); *H04B 17/0057* (2013.01)
USPC ......................................................... 323/315

(58) Field of Classification Search
USPC .................... 323/312, 313, 315, 316; 324/11; 327/51–56, 65–67, 72, 73, 76, 77, 87, 327/89, 95, 97
See application file for complete search history.

(56) References Cited

U.S. PATENT DOCUMENTS

| | | | | |
|---|---|---|---|---|
| 5,384,501 A | * | 1/1995 | Koyama et al. | 327/336 |
| 6,812,872 B1 | * | 11/2004 | Lu | 341/101 |
| 7,271,623 B2 | * | 9/2007 | Palmer | 327/52 |

* cited by examiner

*Primary Examiner* — Adolf Berhane
*Assistant Examiner* — Gary Nash
(74) *Attorney, Agent, or Firm* — McClure, Qualey & Rodack, LLP

(57) ABSTRACT

A signal level detector and detecting method are provided. In one implementation a method includes receiving a differential input signal; incorporating two configurable rectifiers of the same circuit topology; configuring a first one of the two configurable rectifiers as a inverting rectifier to generate an inverting end of an output signal in response to an absolute value of the differential input signal; and configuring a second one of the two configurable rectifiers as a non-inverting rectifier to generate a non-inverting end of the output signal.

15 Claims, 2 Drawing Sheets

SIGNAL LEVEL DETECTOR AND METHOD THEREOF

FIELD OF TECHNOLOGY

The present invention is generally directed to signal level detection and more particularly to systems and methods for signal level detection using configurable rectifiers.

BACKGROUND

Received signal strength indicator (RSSI) is a measurement of a power present in a received signal of a communication receiver. In practice, the received signal is usually an AC (alternating current) signal. To detect the power present in an AC signal, a rectification circuit is needed. By rectification, an AC signal is converted into a DC (direct current) signal, whose power can be conveniently measured. In prior art, the rectification circuit is usually accomplished by using a diode circuit. However, a diode has an inherent non-zero threshold voltage (which is typically 0.6V) and therefore a diode circuit cannot rectify a small AC signal whose amplitude is below its threshold voltage.

What is disclosed is a method and apparatus for detecting a small received signal.

SUMMARY

In an embodiment, an apparatus for detecting a level of a differential input signal comprises: a complementary rectifier for outputting a differential output signal in response to an absolute value of the differential input signal, and a load circuit for providing a termination to the complementary rectifier, wherein the complementary rectifier comprises an inverting rectifier for outputting an inverting end of the output signal and a non-inverting rectifier for outputting a non-inverting end of the output signal. The inverting rectifier and the non-inverting rectifier are of the same circuit topology but different connectivity for coupling to the differential input signal. In a further embodiment, the apparatus includes a current source for establishing a biasing current for the complementary rectifier.

In an embodiment, an apparatus for detecting a level of a differential input signal comprises: an inverting rectifier for receiving a differential input signal and outputting an inverting end of a differential output signal in response to an absolute value of the differential input signal; a non-inverting rectifier for receiving the differential input signal and outputting a non-inverting end of the differential output signal in response to the absolute value of the differential input signal; and a load circuit to provide a termination for the differential output signal. The inverting rectifier and the non-inverting rectifier are of the same circuit topology but different connectivity for coupling to the differential input signal. In a further embodiment, the apparatus includes a current source for establishing a biasing current to be shared by both the inverting rectifier and the non-inverting rectifier.

In an embodiment, a configurable rectifier comprises a parallel connection of a first branch and a second branch, the first branch comprising a cascode of a first gain device and a first degeneration device, the second branch comprising a cascode of a second gain device and a second degeneration device; wherein the configurable rectifier is configurable as either an inverting rectifier where an output changes in a direction opposite to a direction of change in the absolute value of a differential input signal, or a non-inverting rectifier where the output changes in the same direction as the direction of change in the absolute value of the differential input signal. In an inverting configuration, the first gain device and the first degeneration device are controlled by a first end of a differential input signal, and the second gain device and the second degeneration device are controlled by a second end of the differential input signal; in a non-inverting configuration, the first gain device and the second degeneration device are controlled by the first end of the differential input signal, and the second gain device and the first degeneration device are controlled by the second end of the differential input signal.

In an embodiment, a method of detecting a level of a differential input signal comprises: receiving the differential input signal comprising a first end and a second end; using an inverting rectifier to output a negative end of an output signal in response to an absolute value of a difference between the first end and the second end of the differential input signal; and using a non-inverting rectifier to output a positive end of the output signal in response to the absolute value of the difference between the first end and the second end of the differential input signal. The inverting rectifier and the non-inverting rectifier are of the same circuit topology but different connectivity for coupling to the differential input signal. In a further embodiment, the method includes using a load circuit with a low-pass filtering function to provide a termination for the output signal. In a further embodiment, the method includes establishing a common biasing current for both the inverting rectifier and the non-inverting rectifier.

In an embodiment, a method of detecting a level of a differential input signal is disclosed, the method comprising: receiving the differential input signal; incorporating two configurable rectifiers of the same circuit topology; configuring a first one of the two configurable rectifiers as an inverting rectifier to generate an inverting end of an output signal in response to an absolute value of the differential input signal; and configuring a second one of the two configurable rectifiers as a non-inverting rectifier to generate a non-inverting end of the output signal.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Before detailed specifications of the present invention are disclosed, a brief definition of some terminology is given first. A rectifier is a circuit that fulfills a rectification function. A circuit exhibits a rectification function if the circuit responds to an absolute value of a differential input signal regardless of a sign of the differential input signal. An inverting rectifier is a rectifier whose output changes in an opposite direction with respect to a direction of change in the absolute value of the differential input signal; that is, the output of the inverting rectifier decreases (increases) when the absolute value of the differential input signal increases (decreases). A non-inverting rectifier is a rectifier whose output changes in the same direction as a direction of change in the absolute value of the differential input signal; that is, the output of the inverting rectifier increases (decreases) when the absolute value of the differential input signal increases (decreases). The forgoing reflects how Applicant believes persons skilled in the art will understand a rectification function or rectification circuit, and those terms, as used in this application, should be construed accordingly.

The present invention discloses a configurable rectifier circuit that can be configured as either an inverting rectifier or a non-inverting rectifier. By using two configurable rectifiers, configuring one as an inverting rectifier to generate an inverting end of a differential output signal, and configuring the other as a non-inverting rectifier to generate a non-inverting end of the differential output signal, one can generate a differential output signal in response to an absolute value of a differential input signal.

Figure 1:
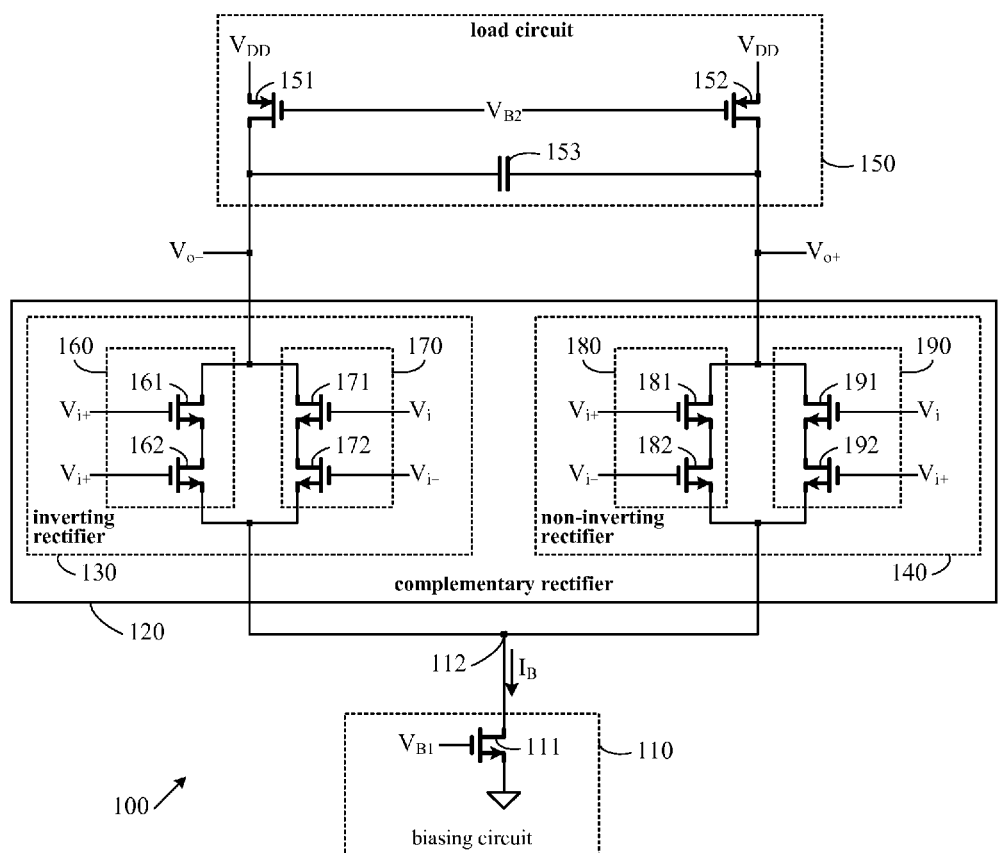
FIG. 1 shows a schematic diagram of an embodiment of a signal level detector according to this invention.

An embodiment 100 of a signal level detector in accordance with the present invention is depicted in FIG. 1. Throughout this disclosure, differential signaling is used, where a differential signal, or signal for short, is defined as a difference between a first end (referred to as the "+" end, or the non-inverting end) and a second end (referred to as the "−" end, or the inverting end). To be specific, a differential input signal (i.e., a signal to be detected) is defined as the difference between $V_{i+}$ and $V_{i-}$, where $V_{i+}$ and $V_{i-}$ are the first end and the second end of the differential input signal of the signal level detector, respectively. Likewise, an output signal is defined as the difference between $V_{o+}$ and $V_{o-}$, where $V_{o+}$ and $V_{o-}$ are the first end and the second end of the differential output signal of the signal level detector, respectively. Embodiment 100 comprises: a biasing circuit (also known as a current source) 110 for generating a biasing current $I_B$; a complementary rectifier 120 biased by the biasing current $I_B$ for converting the input signal $V_i$ (which comprises two ends $V_{i+}$ and $V_{i-}$) into the output signal $V_o$ (which comprises two ends $V_{o+}$ and $V_{o-}$); and a load circuit 150 serving as a load to the complementary rectifier 120. One of embodiments of the biasing circuit 110 comprises a first NMOS (n-type metal oxide field effect transistor) 111 for outputting the biasing current $I_B$ based on a first biasing voltage $V_{B1}$. One of embodiments of the complementary rectifier 120 comprises an inverting rectifier 130 and a non-inverting rectifier 140; the inverting rectifier 130 and the non-inverting rectifier 140 share the common biasing current $I_B$; the inverting rectifier 130 outputs the "−" end of the output signal $V_o$, while the non-inverting rectifier 140 outputs the "+" end of the output signal $V_o$. One of embodiments of the load circuit 150 comprises: a first PMOS (p-type metal oxide field effect transistor) 151 for serving as a pull-up load for the inverting rectifier 130; a second PMOS 152 for serving as a pull-up load for the non-inverting rectifier 140; and a capacitor 153 shunt between the "+" end and the "−" end of the output signal $V_o$ for providing a low-pass filtering function for the output signal $V_o$. The first PMOS 151 and the second PMOS 152 are both biased by a second biasing voltage $V_{B2}$, and also both are coupled to a power supply node $V_{DD}$ for providing the pull-up function.

Figure 2A:
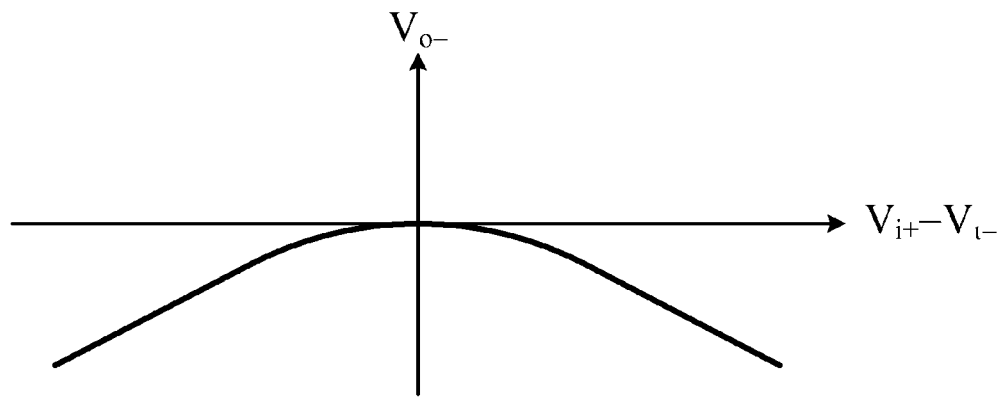
FIG. 2A shows transfer characteristics of an inverting rectifier in FIG. 1.
Figure 2B:
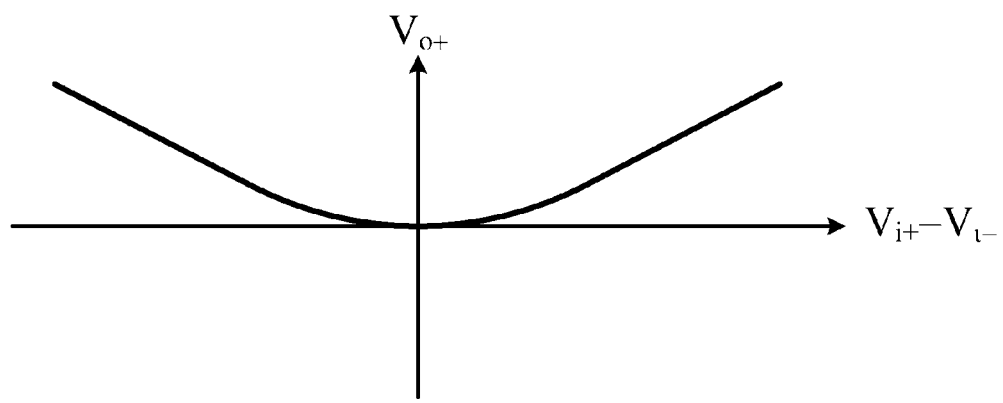
FIG. 2B shows transfer characteristics of a non-inverting rectifier in FIG. 1.
Figure 2C:
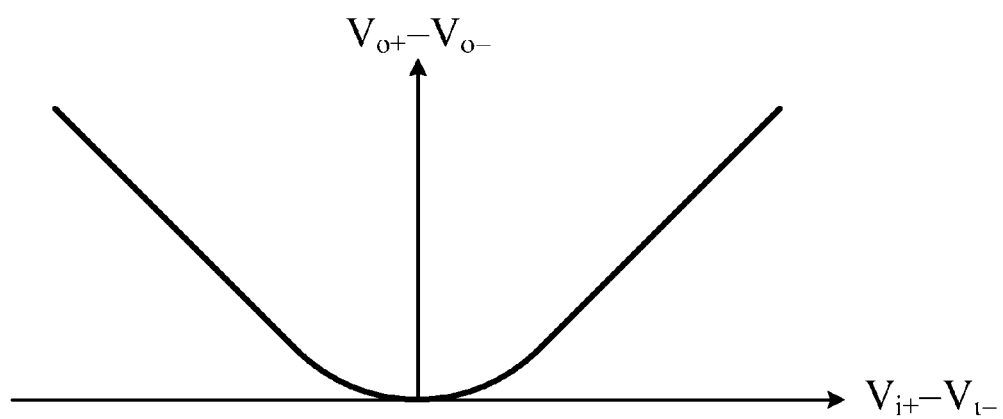
FIG. 2C shows transfer characteristics of a complementary rectifier in FIG. 1.

In a preferred embodiment, the inverting rectifier 130 and the non-inverting rectifier 140 have the same rectification circuit topology and receive the same input signal, but use different schemes of coupling to the input signal. In other words, both the inverting rectifier 130 and the non-inverting rectifier 140 are of the same circuit topology of a configurable rectifier that can be configured as either an inverting rectifier or a non-inverting rectifier. The rectification circuit topology used by both of the inverting rectifier 130 and the non-inverting rectifier 140 comprises: a parallel connection of two branches of circuits, say a left branch and a right branch; and each of the two branches of circuit comprises a gain device in cascode with a degeneration device. To be specific: the inverting rectifier 130 (the non-inverting rectifier 140) comprises a parallel combination of a left branch 160 (180) and a right branch 170 (190); the left branch 160 (180) comprises a first gain device embodied by NMOS 161 (181) in cascode with a first degeneration device embodied by NMOS 162 (182), while the right branch 170 (190) comprises a second gain device embodied by NMOS 171 (191) in cascode with a second degeneration device embodied by NMOS 172 (192). For the inverting rectifier 130: on the left branch 160, both the first gain device (i.e. NMOS 161) and the first degeneration device (i.e., NMOS 162) receives $V_{i+}$, i.e., the "+" end of the input signal; on the right branch 170, both the second gain device (i.e. NMOS 171) and the second degeneration device (i.e. NMOS 172) receives $V_{i-}$, i.e. the "−" end of the input signal. Transfer characteristics of the inverting rectifier 130 in FIG. 1 are shown in FIG. 2A; its output $V_{o-}$ decreases when an absolute value of the input signal increases: either $V_{i+}-V_{i-}$ is positive and becoming more positive, or $V_{i+}-V_{i-}$ is negative and becoming more negative. The inverting rectifier 130 possesses a rectification function because its output is determined by the absolute value of the input signal, and independent of the sign of the input signal; the inverting rectifier 130 possesses an inverting function because its output decreases when its input signal increases in absolute value. For the non-inverting rectifier 140: on the left branch 180, the first gain device (i.e. NMOS 181) and the first degeneration device (i.e., NMOS 182) receives $V_{i+}$ and $V_{i-}$, respectively; on the right branch 190, the second gain device (i.e. NMOS 191) and the second degeneration device (i.e., NMOS 192) receives $V_{i-}$ and $V_{i+}$, respectively. Transfer characteristics of the non-inverting rectifier 140 are shown in FIG. 2B; its output $V_{o+}$ increases when an absolute value of the input signal increases: either $V_{i+}-V_{i-}$ is positive and becoming more positive, or $V_{i+}-V_{i-}$ is negative and becoming more negative. The non-inverting rectifier 140 possesses a rectification function because its output is determined by the absolute value of the input signal, and independent of the sign of the input signal; the non-inverting rectifier 140 possesses a non-inverting function because its output increases when its input signal increases in absolute value. An overall transfer characteristic of the complementary rectifier 120 is shown in FIG. 2C. It shows a rectification function, wherein the output $V_{o+}-V_{i-}$ increases when the input $V_{i+}-V_{i-}$ increases in absolute value. Due to using a combination of both an inverting rectifier (i.e. 130) and a non-inverting rectifier (i.e. 140), the complementary rectifier 120 has a higher gain than either a stand-alone inverting rectifier or a stand-alone non-inverting rectifier. Due to using the high-gain complementary rectifier 120, the embodiment 100 is effective in detecting a low level signal.

The load circuit 150 is used to provide a termination for the complementary rectifier 120. The first PMOS 151 and the second PMOS 152 serve as a pair of pull-up loads for the complementary rectifier 120. The shunt capacitor 153 is used to provide a low-pass filtering function, which is used to filter out high-frequency fluctuation on the output signal $V_o$. Those of ordinary skill in the art may choose to use alternative load circuits, as long as the function of providing termination and low-pass filtering is served.

Those of ordinary skill in the art may choose to use a "flipped" alternative to embodiment 100, i.e., replace every NMOS with a PMOS, replace every PMOS with a NMOS, replace coupling to $V_{DD}$ with coupling to ground, and replace coupling to ground with coupling to $V_{DD}$ (i.e., replace pull-up to $V_{DD}$ using PMOS with pull-down to ground using NMOS). In doing so, the resultant embodiment has exactly the same function as the original embodiment.

In an alternative embodiment not shown in figure, the biasing circuit 110 of FIG. 1 is removed, and the circuit node 112 is directly coupled to ground. This alternative embodiment still fulfills the rectification function, but the transfer characteristics of the rectification are more sensitive to a common mode value (i.e., an average value of $V_{i+}$ and $V_{i-}$) of the differential input signal. By using the biasing circuit 110, in contrast, the transfer characteristics of the rectification are less sensitive to the common mode of the differential input signal.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus for detecting a level of a differential input signal, the apparatus comprising:
    a complementary rectifier to output a differential output signal in response to an absolute value of the differential input signal, the complementary rectifier comprising:
        an inverting rectifier to output an inverting end of a differential output signal in response to the absolute value of the differential input signal; and
        a non-inverting rectifier to output a non-inverting end of the differential output signal in response to the absolute value of the differential input signal; and
    a load circuit to provide a termination for the complementary rectifier.

2. The apparatus of claim 1, further comprising:
    a current source for outputting a biasing current shared by both the inverting rectifier and the non-inverting rectifier.

3. The apparatus of claim 1, wherein the load circuit functions as a low-pass filter.

4. The apparatus of claim 1, wherein: the inverting rectifier and the non-inverting rectifier are of the same circuit topology but different connectivity for coupling to the differential input signal.

5. The apparatus of claim 4, wherein: the inverting rectifier comprises a parallel connection of a first branch and a second branch, the first branch comprising a cascode of a first gain device and a first degeneration device, the second branch comprising a cascode of a second gain device and a second degeneration device, the first gain device and the first degeneration device receiving a first end of the differential input signal, the second gain device and the second degeneration device receiving a second end of the differential input signal.

6. The apparatus of claim 4, wherein: the non-inverting rectifier comprises a parallel connection of a first branch and a second branch, the first branch comprising a cascode of a first gain device and a first degeneration device, the second branch comprising a cascode of a second gain device and a second degeneration device, the first gain device and the second degeneration device receiving a first end of the differential input signal, the second gain device and the first degeneration device receiving a second end of the differential input signal.

7. The apparatus of claim 4, wherein: the inverting end of the differential output signal decreases in response to an increase to the absolute value of the differential input signal, and the non-inverting end of the differential output signal increases in response to the increase to the absolute value of the differential input signal.

8. The apparatus of claim 1, wherein: the inverting end of the differential output signal decreases in response to an increase to the absolute value of the differential input signal, and the non-inverting end of the differential output signal increases in response to the increase to the absolute value of the differential input signal.

9. The apparatus of claim 1, further comprising:
    a biasing circuit for providing a current source to bias the complementary rectifier.

10. A configurable rectifier comprising a parallel connection of a first branch and a second branch, the first branch comprising a cascode of a first gain device and a first degeneration device, the second branch comprising a cascode of a second gain device and a second degeneration device; wherein the configurable rectifier is configurable as either an inverting rectifier where an output changes in an opposite direction to a direction of change in an absolute value of a differential input signal, or a non-inverting rectifier where the output changes in the same direction as a direction of change in the absolute value of the differential input signal, wherein in an inverting configuration, the first gain device and the first degeneration device are controlled by a first end of a differential input signal.

11. The configurable rectifier of claim 10, wherein in a non-inverting configuration, the first gain device and the second degeneration device are controlled by the first end of the differential input signal, and the second gain device and the first degeneration device are controlled by the second end of the differential input signal.

12. A method of detecting a level of a differential input signal, the method comprising:
    receiving a differential input signal;
    incorporating two configurable rectifiers of the same circuit topology;
    configuring a first one of the two configurable rectifiers as an inverting rectifier to generate an inverting end of an output signal in response to an absolute value of the differential input signal; and
    configuring a second one of the two configurable rectifiers as a non-inverting rectifier to generate a non-inverting end of the output signal, wherein the non-inverting rectifier comprises a parallel connection of a first branch and a second branch, the first branch comprising a cascode of a first gain device and a first degeneration device, the second branch comprising a cascode of a second gain device and a second degeneration device, the first gain device and the second degeneration device receiving a first end of the differential input signal, the second gain device and the first degeneration device receiving a second end of the differential input signal.

13. The method of claim 12, further comprising: using a current source to bias the two configurable rectifiers.

14. The method of claim 12, wherein the inverting rectifier comprises a parallel connection of a first branch and a second branch, the first branch comprising a cascode of a first gain device and a first degeneration device, the second branch comprising a cascode of a second gain device and a second degeneration device, the first gain device and the first degeneration device receiving a first end of the differential input signal, the second gain device and the second degeneration device receiving a second end of the differential input signal.

15. The method of claim 12 further comprising: terminating the two configurable rectifiers with a load circuit of a low-pass function.

* * * * *